United States Patent [19]
Maekawa

[11] Patent Number: 5,940,693
[45] Date of Patent: Aug. 17, 1999

[54] SELECTIVE SILICIDE THIN-FILM TRANSISTOR AND METHOD FOR SAME

[75] Inventor: Masashi Maekawa, Vancouver, Wash.

[73] Assignees: Sharp Laboratories of America, Inc., Camas, Wash.; Sharp Kabushiki Kaisha, Osaka, Japan

[21] Appl. No.: 08/893,285

[22] Filed: Jul. 15, 1997

[51] Int. Cl.⁶ .................................................. H01L 21/324
[52] U.S. Cl. ........................... 438/166; 438/486; 438/487
[58] Field of Search .............................. 438/30, 166, 486, 438/487, 308, FOR 155, FOR 184, FOR 201, FOR 333, FOR 334, FOR 393

[56] References Cited

U.S. PATENT DOCUMENTS

| | | | |
|---|---|---|---|
| 5,147,826 | 9/1992 | Liu et al. | 438/166 |
| 5,275,851 | 1/1994 | Fonash et al. | 427/578 |
| 5,403,772 | 4/1995 | Zhang et al. | 438/166 |
| 5,426,064 | 6/1995 | Zhang et al. | 438/166 |
| 5,488,000 | 1/1996 | Zhang et al. | 438/166 |
| 5,501,989 | 3/1996 | Takayama et al. | 438/166 |
| 5,543,352 | 8/1996 | Ohtani et al. | 438/166 |
| 5,569,610 | 10/1996 | Zhang et al. | 438/166 |
| 5,580,792 | 12/1996 | Zhang et al. | 438/166 |
| 5,595,923 | 1/1997 | Zhang et al. | 438/166 |
| 5,605,846 | 2/1997 | Ohtani et al. | 438/166 |
| 5,624,851 | 4/1997 | Takayama et al. | 438/166 |
| 5,637,515 | 6/1997 | Takemura | 438/166 |
| 5,639,698 | 6/1997 | Yamazaki et al. | 117/8 |
| 5,643,826 | 7/1997 | Ohtani et al. | 438/166 |
| 5,654,203 | 8/1997 | Ohtani et al. | 438/166 |
| 5,712,191 | 1/1998 | Nakajima et al. | 438/166 |
| 5,773,329 | 6/1998 | Kyo | 438/166 |
| 5,783,468 | 7/1998 | Zhang et al. | 438/166 |
| 5,789,284 | 8/1998 | Yamazaki et al. | 438/166 |
| 5,814,540 | 9/1998 | Takemura et al. | 438/166 |
| 5,814,573 | 10/1998 | Zhang et al. | 438/166 |
| 5,821,138 | 10/1998 | Yamazaki et al. | 438/166 |

OTHER PUBLICATIONS

Article entitled, "Low Temperature Poly–Si Thin–Film Transistor Fabrication by Metal–Induced Lateral Crystallization" by Seok–Woon Lee and Seung–Ki Joo, printed in the IEEE Electron Device Letters, vol. 17, No. 4, Apr. 1996.

Article entitled, "Al Induced Crystallization of a–Si" by G. Radnoczi, A. Robertsson, H.T.G. Hentzell, S.F. Gong and M.–A Hasan, accepted for publ. 9 Jan. 1991 in the J. Appl. Phys. 69, pp. 6394–6399.

Article entitled, "Silicide formation and Silicide–mediated Crystallization of Nickel–Implanted Amorphous Silicon Thin Films" by C. Hayzelden and J. L. Batstone, accept for publication Feb. 26, 1993 J. Appl. Phys. 73(12), Jun. 15, 1993, pp. 8279–8289.

Article entitled, "Pd Induced Lateral Crystallization of Amorphous Si Thin Films", by Seok–Woon Lee, Yoo–Chan Jeon and Seung–Ki Joo, accepted for publication Jan. 1995, Appl. Phys. Lett. 66(13), Mar. 27, 1995, pp. 1671–1673.

Primary Examiner—Mary Wilczewski
Attorney, Agent, or Firm—Gerald Maliszweski; David C. Ripma

[57] ABSTRACT

A method for annealing amorphous silicon film to produce polycrystalline film suitable for thin-film transistors fabricated on glass substrates is provided. The method involves using the selective location of nickel on a predetermined region of silicon to define the pattern of the lateral growth front as the silicon is crystallized. The method defines the resistivity of the silicide formed. The method also defines a specific range of nickel thicknesses to form the nickel silicide. A minimum thickness ensures that a continuous layer of nickel silicide exists on the growth front to promote an isotropic lateral growth front to form a crystalline film having high electron mobility. A maximum thickness limit reduces the risk of nickel silicide enclaves in the crystalline film to degrade the leakage current. Strategic placement of the nickel helps prevent nickel silicide contamination of the transistor channel regions, which degrade the leakage current. A TFT polycrystalline film is also provided made by the above mentioned process of using a defined thickness, silicide resisitivity, and placement of nickel on amorphous silicon to form a silicide which induces a controlled crystallization growth front.

20 Claims, 11 Drawing Sheets

SELECTIVE SILICIDE THIN-FILM TRANSISTOR AND METHOD FOR SAME

BACKGROUND AND SUMMARY OF THE INVENTION

This invention relates generally to thin-film transistor (TFT) processes and fabrication, and more particularly, to a TFT polycrystalline film, and method of selectively forming transition metals semiconductor compounds, such as nickel suicide, to induce the crystallizing of an amorphous film.

The demand for smaller electronic consumer products with higher resolution displays, spurs continued research and development in the area of liquid crystal displays (LCDs). The size of LCDs can be decreased by incorporating the large scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin-film transistor (TFT). TFTs are typically fabricated on a transparent substrate such as quartz, glass, or even plastic. TFTs are almost exclusively used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield smaller LCD screens, lower power consumption, and faster transistor response times. Further LCD resolution enhancements will require that the TFTs mounted on the transparent substrates have electron mobility characteristics rivaling IC driver circuits currently mounted along the edges of the screen. That is, display and driver TFT located across the entire display must operate at substantially the same level of performance.

The carrier mobility of typical thin-film transistors, with active areas formed from amorphous film, is poor, on the order of 0.1 to 0.2 $cm^2/Vs$. Carrier mobility is improved by using crystallized silicon. Single crystal silicon transistors, which are usually used in TFT driver circuits, have electron mobilities on the order of 500 to 700 $cm^2/Vs$. Polycrystalline silicon transistor performance is between the two extremes, having mobilities on the order of 10 to 400 $cm^2/Vs$. Thin-film transistors having mobilities greater than 100 $cm^2/Vs$ would probably be useful in replacing LCD periphery mounted driver circuitry. However, it has been difficult to produce polycrystalline TFTs with electron mobilities of even 40 to 50 $cm^2/Vs$.

Single crystal silicon films, for use with LCDs, are difficult to fabricate when adhered to relatively fragile transparent substrates. A quartz substrate is able to withstand high process temperatures, but it is expensive. Glass is inexpensive, but is easily deformed when exposed to temperatures above 600° C. for substantial lengths of time. Even the fabrication of polycrystalline silicon transistors has been very difficult due to the necessity of using low temperature crystalline processes when glass is involved. Current polycrystalization processes typically require annealing times of approximately 24 hours, at 600° C., to produce TFTs having a mobility of approximately 30–50 $cm^2/Vs$. These processes are not especially cost effective due to the long process times, and the TFTs produces are not suitable for LCD driver circuits.

The process of heating amorphous silicon to form crystallized silicon is not entirely understood, and research on the subject continues. Variations in temperature, film thickness, the degree to which the amorphous matter melts, impurities in the film, and a range of other factors influence the annealing of amorphous silicon. Generally, large grains of crystallization, or crystallization able to support high carrier mobilities, occur in a polycrystalline film at a specific temperature near the melting point. Temperatures below this preferred temperature do not melt the amorphous silicon enough to form large grain areas, or to form uniformly crystallized film. Temperatures above the preferred temperature rapidly lead to bulk nucleation. The bulk nucleation of amorphous matter results in the spontaneous crystallization of an amorphous film into relatively small grain sizes so that the electron mobility is relatively poor.

Various annealing methods exist for turning amorphous silicon into polycrystalline silicon. The direct deposition of amorphous silicon film is probably the cheapest method of fabricating TFTs. Typically, the transparent substrate is mounted on a heated susceptor. The transparent substrate is exposed to gases which include elements of silicon and hydrogen. The gases decompose to leave solid phased silicon on the substrate. In a plasma-enhanced chemical vapor deposition (PECVD) system, the decomposition of source gases is assisted with the use of radio frequency (RF) energy. A low-pressure (LPCVD), or ultra-high vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources, are used. In a hot wire CVD system the production of activated hydrogen atoms leads to the decomposition of the source gases. However, TFTs made from direct deposition have poor performance characteristics, with mobilities on the order of 1 to 10 $cm^2/Vs$.

Solid phase crystallization (SPC) is a popular method of crystallizing silicon. In this process, amorphous silicon is exposed to heat approaching 600° C. for a period of at least several hours. Typically, large batches of LCD substrates are processed in a furnace having a resistive heater source. TFTs made from this crystallization process are more expensive than those made from direct deposition, but have mobilities on the order of 50 $cm^2/Vs$. A rapid thermal anneal (RTA) uses a higher temperature but for very short durations of time. Typically, the substrate is subjected to temperatures approaching 700 or 800° C. during the RTA, however, the annealing process occurs relatively quickly, in minutes or seconds. Glass substrates remain unharmed due to the short exposure time. Because the process is so rapid, it is economical to process the substrates serially. Single substrates can also be brought up to annealing temperatures faster than large batches of substrates. A tungsten-halogen, or Xe Arc, heat lamp is often used as the RTA heat source.

An excimer laser crystallization (ELC) process has also been used with some success in annealing amorphous silicon. The laser allows areas of the amorphous film to be exposed to very high temperatures for very short periods of time. Theoretically, this offers the possibility of annealing the amorphous silicon at its optimum temperature without degrading the transparent substrate upon which it is mounted. However, use of this method has been limited by the lack of control over some of the process steps. Typically, the aperture size of the laser is relatively small. The aperture size, power of the laser, and the thickness of the film may require multiple laser passes, or shots, to finally anneal the silicon. Since it is difficult to precisely control the laser, the multiple shots introduce non-uniformities into the annealing process. Further, the wafers must be annealed serially, instead of in a furnace in batches. Although mobilities of over 100 $cm^2$/Vs are obtainable, TFTs made by this method are significantly more expensive than those made by direct deposition or SPC.

Also under investigation is the use of metal, such as aluminum, indium tin oxide, and transition metals such as nickel, cobalt, and palladium to encourage the crystallization of silicon. Nickel seems especially promising, as the lattice mismatch between nickel disilicide and silicon is small, on the order of 3%. In general, nickel has been used to reduce the annealing temperature typically required in a conventional solid phase crystallization (SPC) from approximately 600° C. to a temperature in the range between approximately 500 to 550° C., so that the LCD substrates are less susceptible to shrinkage. The use of nickel also significantly shortens the annealing process times. TFTs made through this process cost about the same as those made with the SPC method, however, the mobilities of metal-induced TFTs can approach 100 $cm^2$/Vs. Liu et al., U.S. Pat. No. 5,147,826, disclose the deposition of a non-continuous metal film on amorphous silicon so that the annealing temperature can be reduced to approximately 550 to 650° C. Fonash et al., U.S. Pat. No. 5,275,851 disclose a method of depositing a non-continuous metal film to selected areas of silicon to crystallize those selective areas of silicon. However, neither method fosters the silicide-enhanced lateral crystal growth needed to fabricate polycrystalline silicon TFTs with very high electron mobility.

An improvement to the SPC or laser annealing process is presented in co-pending U.S. patent Ser. No. 08/812,580, filed Mar. 7, 1997, now U.S. Pat. No. 5,827,773, entitled "Polycrystalline Silicon from the Crystallization of Microcrystalline Silicon and Method for Same", invented by Tolis Voutsas, Attorney Docket No. SMT 187 which is assigned to the same assignees as the instant application. This patent application discloses the use of amorphous film with embedded microcrystallites to produce polycrystalline silicon. The polycrystalline silicon has a more uniform distribution of crystal structures, and larger crystal grains. However, the invention does not address the subject of increasing the quality, and reducing the costs, of metal-induced crystallized film.

A method of rapid thermal annealing nickel silicide with amorphous silicon is presented in co-pending U.S. patent Ser. No. 08/879,386, filed Jun. 20, 1997, entitled "Thin-Film Transistor Polycrystalline Film Through Nickel Induced, Rapid Thermal Annealing and Method for Same", invented by Masashi Maekawa, Attorney Docket No. SMT 258 which is assigned to the same assignees as the instant application. This patent application discloses the use of an RTA process to increase the quality of the polycrystalline, and to reduce annealing times. However, the invention does not disclose a method of selectively depositing nickel on the silicon to prevent the incursion of nickel into the channel area of a transistor.

It would be advantageous if a method were found of annealing amorphous silicon to form polycrystalline TFT transistors on glass substrates with electron mobilities exceeding 100 $cm^2$/Vs.

It would be advantageous if a method were found for using a salicide process to fabricate a high quality polycrystalline film suitable for TFTs with high electron mobility and low leakage currents.

It would be advantageous if a method were found of placing the silicide metal in predetermined regions of source/drain areas to minimize the incursion of silicide into the channel regions of a transistor.

It would also be advantageous if a thickness and continuity of transition metal could be determined to assist in the formation of a high quality crystalline film without contaminating the channel regions.

Accordingly, a method of crystallizing an amorphous film has been provided comprising the steps of:

a) depositing a layer of amorphous film having a thickness of approximately 500 Å;

b) depositing a continuous transition metal film having a thickness of approximately 30 Å, in contact with selected areas of the amorphous film having a surface area of approximately 5 microns$^2$;

c) annealing, at a temperature in the range between 250 and 550° C., the films deposited in steps a) and b) so that the selected areas of amorphous film in contact with the continuous transition metal film are consumed to form a film of continuous transition metal semiconductor compound; and d) annealing, at a temperature of approximately 730° C., to convert, at least partially, the amorphous film into polycrystalline film. The continuous transition metal semiconductor compound film assists in crystallization along a controlled growth front. Preferably, the amorphous film is silicon and the transition metal is nickel.

A more narrowed focus of the invention concentrates on forming thin-film transistors having low leakage current, and provides a method for crystallizing an amorphous film comprising the steps of:

a) depositing a layer of the amorphous film having a first thickness;

b) depositing a continuous transition metal film having a second thickness overlying, and in contact with, selected areas of the amorphous film;

c) annealing the films deposited in steps a) and b) so that the selected areas of amorphous film underlying the continuous transition metal film are consumed to form a continuous film of transition metal semiconductor compound; and d) annealing to convert, at least partially, the amorphous film into a polycrystalline film, whereby the selective placement of the transition metal controls the crystallization growth front.

A thin-film transistor (TFT) is also provided comprising a transparent substrate, and a continuous transition metal semiconductor compound film overlying the transparent substrate, formed by depositing a continuous transition metal film, having a second thickness, on selected areas of an amorphous film having a first thickness. After the deposition of the continuous transition metal film, a first annealing process is performed to form the continuous transition metal semiconductor compound film. The TFT also comprises a TFT polycrystalline semiconductor film, overlying the transparent substrate and in contact with the continuous transition metal semiconductor compound film. The polycrystalline film is formed from performing a second step of annealing the continuous transition metal semiconductor compound film in contact with the amorphous film selected areas. The inclusion of the continuous transition metal semiconductor compound film to selected areas of the amorphous film controls the crystallization growth front. In this manner, nickel silicide is used in assisting the crystallization process, but nickel silicide enclaves are excluded from the channel region under the gate oxide layer.

In one aspect of the invention, a dielectric interlevel is deposited over the amorphous film in the fabrication of the transistor. The dielectric interlevel is patterned to form contact holes through the dielectric interlevel which access the amorphous film selected areas. In this manner, the location and size of the amorphous film selected areas are defined, and the formation of transition metal semiconductor compound films is controlled.

DETAILED DESCRIPTION OF THE PREFERRED EMBODIMENTS

Figure 1:
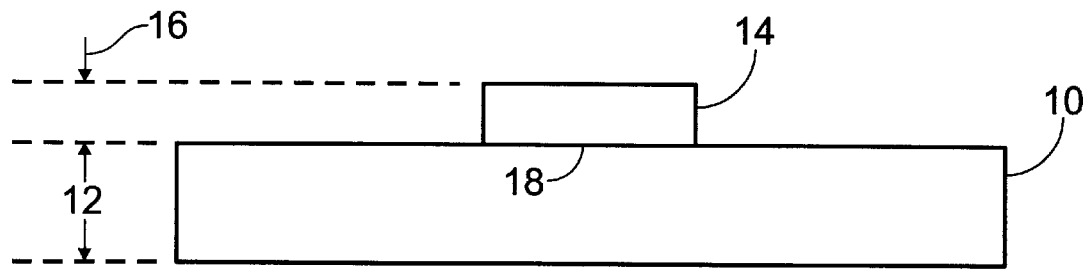
FIGS. 1 through 3b illustrate stages in a selective silicide method of a completed crystallized amorphous film.

FIGS. 1 through 3b illustrate stages in a selective suicide method of a completed crystallized amorphous film. FIG. 1 is a partial cross-section view of a deposited layer of amorphous film 10 having a thickness 12 of approximately 500 Å. Also deposited is a continuous film of transition metal 14 having a thickness 16 of approximately 30 Å. Continuous transition metal film 14 is in contact with selected areas 18 of amorphous film 10.

A continuous transition metal film, as defined herein, refers to proximity of metal atoms to each other, or the density of metal atoms, and is directly related to the electrical conductivity across the metal film. A transition metal film having low resistance is considered to be continuous. The continuity of the metal film is dependent on the method of depositing the metal atoms. E-beam evaporation, on a room temperature amorphous film, is a method of forming a continuous transition metal film. Sputtering is also used, but the amorphous film must be heated to a temperature in the range between 250 and 400° C. to encourage the metal atoms to migrate on the amorphous film surface. In a non-continuous metal film, the metal atoms tend to form isolated globules so that the electrical resistance across the metal film is poor. Film continuity is also related thickness of the transition metal film. Even when the deposited metal atoms freely migrate on the amorphous film surface, a sufficient thickness of metal is necessary to form a continuous transition metal film.

Figure 2A:
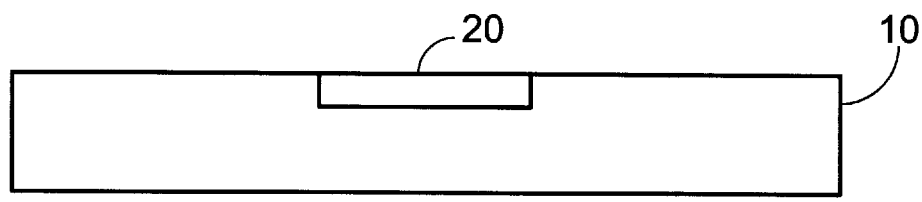

FIG. 2a is a partial cross-sectional view of FIG. 1 after annealing amorphous film 10 and continuous transition metal film 14 at a temperature in the range between 250 and 550° C. In the preferred embodiment, amorphous film 10 is annealed with continuous transition film 14 being nickel. Amorphous film selected areas 18, in contact with continuous transition metal film 14, are consumed to form a continuous film of transition metal semiconductor compound film 20. After annealing, excess transition metal film 14, not transformed by the annealing process, is removed.

Figure 2B:
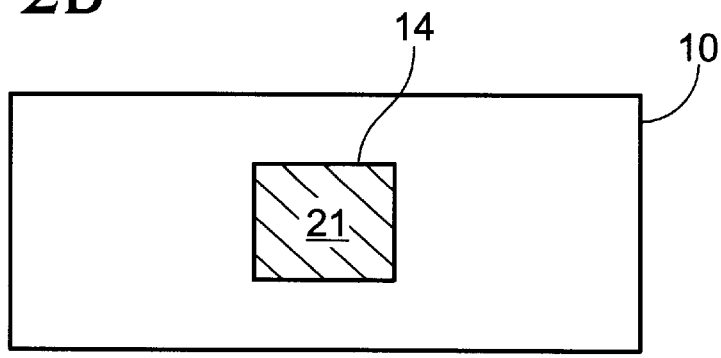

FIG. 2b is a top view of selected area 18 depicted in FIG. 2a. A substantially square surface area 21 of selected area 18 (see FIG. 1) is defined as approximately 5 microns$^2$. Alternately, surface area 21 has a substantially round, rectangular, or any irregular shape (not shown). In some aspects of the invention, a plurality of selected areas 18 are located on the surface of amorphous film 10 (not shown). In addition, selected area 18 of amorphous film 10 is located underneath amorphous film 10, in some invention aspects (not shown). In this form, continuous transition metal film 14 is patterned before the deposition of amorphous film 10 to coincide and align with selected areas 18.

Figure 2C:
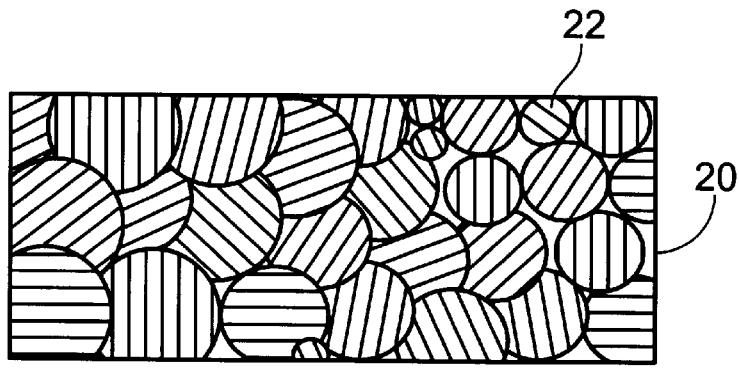

FIG. 2c is a depiction of continuous transition metal semiconductor compound 20 of FIG. 2a at the molecular level. Continuous transition metal film 14, in FIG. 1, is applied in such a manner that a substantially continuous transition metal semiconductor compound film 20 forms after annealing. Continuous film 20 is represented by the close grouping of transition metal semiconductor grains 22. That is, transition metal semiconductor grains 22 are not separated by atoms of unreacted amorphous matter 10.

A continuous transition metal semiconductor compound film, as defined herein, refers to the proximity of transition metal semiconductor compound grains, as represented by grains 22 in FIG. 2c. A transition metal semiconductor compound is a compound formed from an amorphous film and a transition metal after annealing. Some examples of these compounds are nickel silicide and cobalt silicide. A continuous transition metal semiconductor compound film has a low resistance measured across the film. A continuous transition metal semiconductor compound film has a resistivity in the range between 10 and 100 $\mu$19 ohm·cm, and is formed from a continuous film of transition metal film, as defined above following the discussion of FIG. 1. However, only a continuous transition metal film of sufficient thickness is annealed into a continuous transition metal semiconductor compound film. That is, a very thin continuous transition metal film is not annealed into a continuous transition metal semiconductor compound film. The role of transition film thickness is discussed further with regard to FIG. 7, below.

Figure 3A:
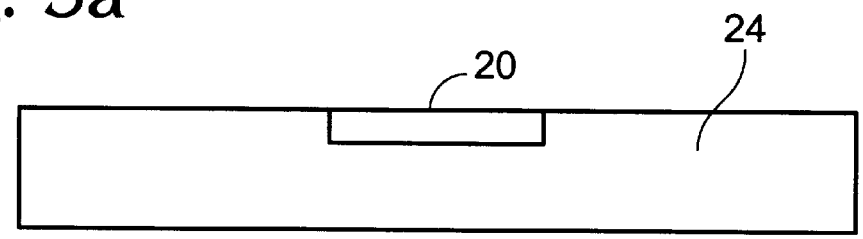

FIG. 3a is a partial cross-sectional view of FIG. 2a following an (second) annealing at a temperature of approximately 730° C. The selection of temperature is limited by the presence of a glass substrate and concern for spontaneous nucleation when amorphous film 10 is fabricated into a TFT. For example, Corning 1737 glass, which is able to withstand an approximately 750° C. rapid thermal annealing temperature, is suitable for this process. Amorphous film 10 is at least partially converted into a polycrystalline film 24. In the preferred aspect of the invention, amorphous film 10 is silicon, continuous transition metal film 14 is nickel, and continuous transition metal semiconductor compound film 20 is nickel silicide. Nickel silicide 20 is understood to mean nickel mono-silicide, nickel disilicide, and mixtures of nickel mono-silicide and disilicide.

Figure 3B:
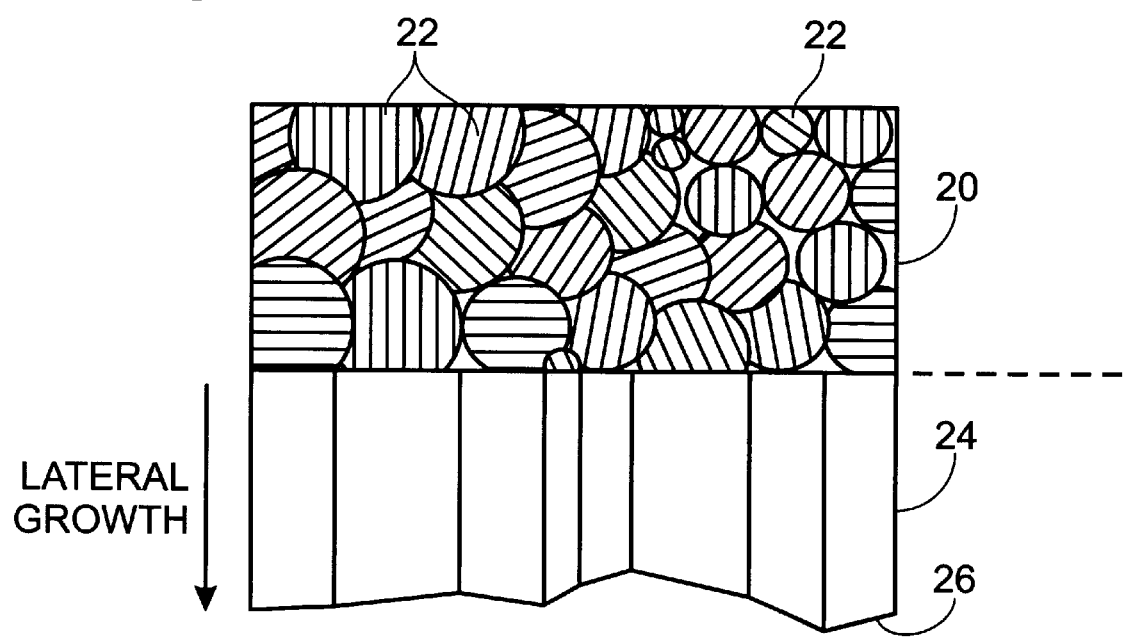

FIG. 3b depicts the uniform growth front 26 of polycrystalline film 24 in FIG. 3a. While not intending to be bound by theory, it is believed that continuous transition metal semiconductor compound film 20 assists in crystallizing along a controlled growth front. The growth front is controlled in that the selective placement of continuous transition metal film 14 minimizes the risk that transition metal semiconductor grains 22 (see FIG. 2c) migrate to sensitive areas of polycrystalline film 24. The growth front is also controlled in that the continuous layer of transition metal semiconductor grains 22 encourage non-fibrous crystal growth at a constant lateral growth velocity.

It is known to use nickel, or other metals, to assist in the crystallization of an amorphous film such as silicon. Metal-assisted crystallization allows lower annealing temperatures to be used, limiting the possibility of deforming a glass LCD substrate upon which the silicon film is annealed for use in a TFT. At the same time, the use of metal permits the annealing times to be reduced, increasing productivity. A method of rapid thermal annealing nickel silicide with amorphous silicon is presented in co-pending U.S. patent Ser. No. 08/879,386 filed Jun. 20, 1997, entitled "Thin-Film Transistor Polycrystalline Film Through Nickel Induced, Rapid Thermal Annealing and Method for Same", invented by Masashi Maekawa. The above mentioned patent application discloses the use of an RTA process to increase the quality of the crystalline film, and profoundly reduce the annealing time. This, above mentioned, patent application is incorporated by reference into the present application. The method of the present invention recognizes that even higher annealing temperatures than those disclosed in the above patent application are useful in converting amorphous matter films into crystalline films. The present application also recognizes that a continuous silicide film is instrumental in promoting lateral growth in the crystallization process.

Figure 4:
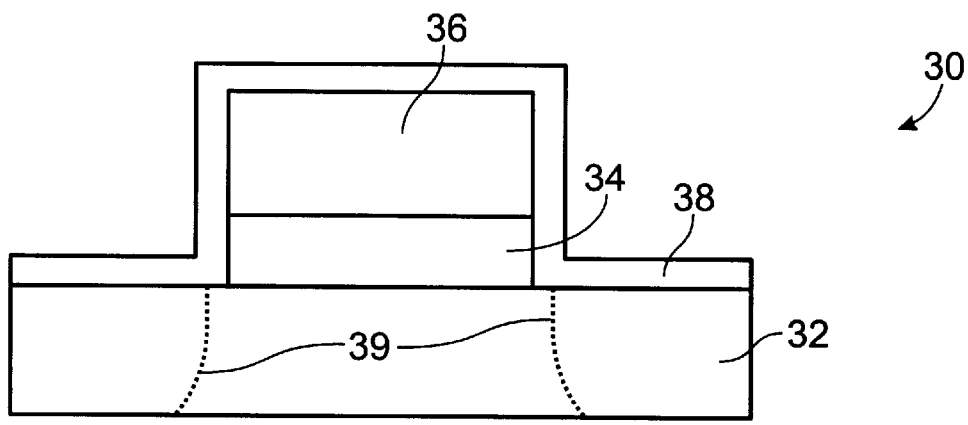
FIGS. 4 through 6 illustrate a salicide process in the fabrication of a transistor (prior art).

FIGS. 4 through 6 illustrate a salicide process in the fabrication of a transistor (prior art). FIG. 4 is a partial cross-sectional view of a transistor 30 in fabrication, including amorphous silicon substrate 32, gate oxide 34, and gate 36. Transistor 30 is shown covered with a layer of metal 38. Typically, the salicide, or self-aligning suicide process, is performed to form a low resistance contact region overlying source/drain regions 39 for interconnection to subsequently deposited metal levels (not shown).

Figure 5A:
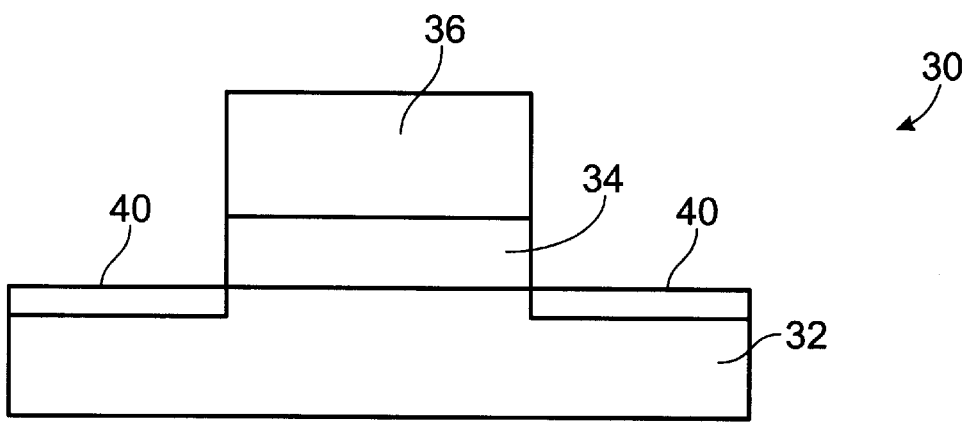

FIG. 5a is a partial cross-sectional view of transistor 30 after an annealing process to form suicide film 40 overlying silicon substrate 32. After annealing, excess metal 38, or metal 38 not annealed with silicon layer 32, is etched away. Typically, metal 38 does not react with gate 36, gate oxide 34, or the surrounding dielectric material (not shown).

The IC industry uses nucleating material, such as nickel, to form a low resistance contact surfaces on single crystal substrates. Even when these substrates are amorphous, such as source/drain regions after the addition of doping impurities, they are annealed into single crystal silicon. Without a glass LCD substrate to protect, high annealing temperatures of approximately 1000° C. can be used to anneal the silicon. Typically, the silicide metal is deposited in layers that are hundreds of angstroms thick. However, prior art processes using silicide for the purposes of crystallizing silicon have typically applied relatively thin films of metal 38. Further, these metal films are also non-continuous as defined above, following the discussion of FIG. 1. That is, non-continuous metal films have poor conductivity. The loosely consolidated silicide grains promote fibrous, as opposed to uniform lateral, crystal growth.

Figure 5B:
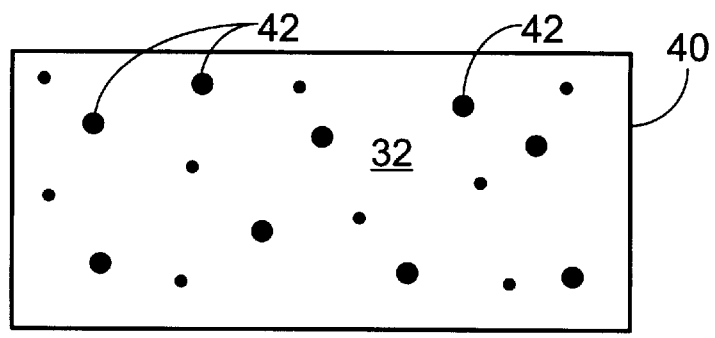

FIG. 5b depicts silicide film 40 of FIG. 5a at the molecular level. After annealing, silicide grains 42 are not tightly grouped together. That is, silicide grains 42 are separated by molecules of amorphous silicon 32 which are included as an element of silicide layer 40. The concentration of conductive silicide grains 42 is related to, and is measured as, the sheet resistance of silicide layer 40. Silicide film 40 is non-continuous and has a resistance of approximately 1000 $\mu$·ohm·cm.

Figure 6A:
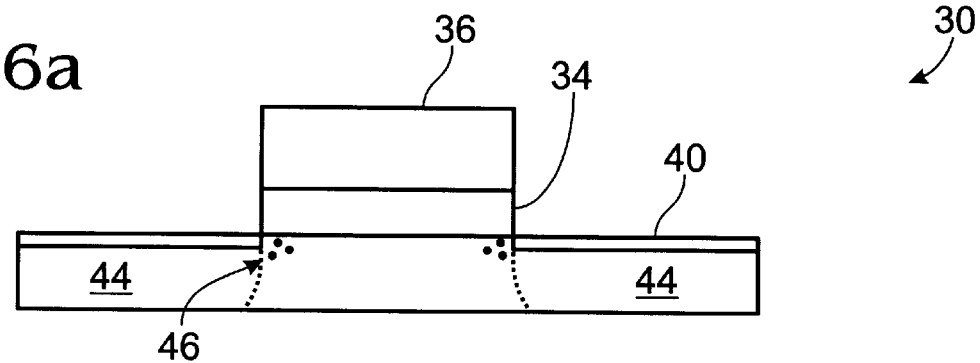

FIG. 6a is a partial cross-sectional view of transistor 30 following a second step of annealing which converts amorphous silicon source/drain regions 39 to a polycrystalline source/drain regions 44. Embedded in polycrystalline layer 44, in the channel region of transistor 30, are silicide grains 46. Silicide grains 46 in the channel region degrade the leakage current. At least some silicide grains 46 are the result of the placement of silicide layer 40 so close to the sensitive channel regions.

Figure 6B:
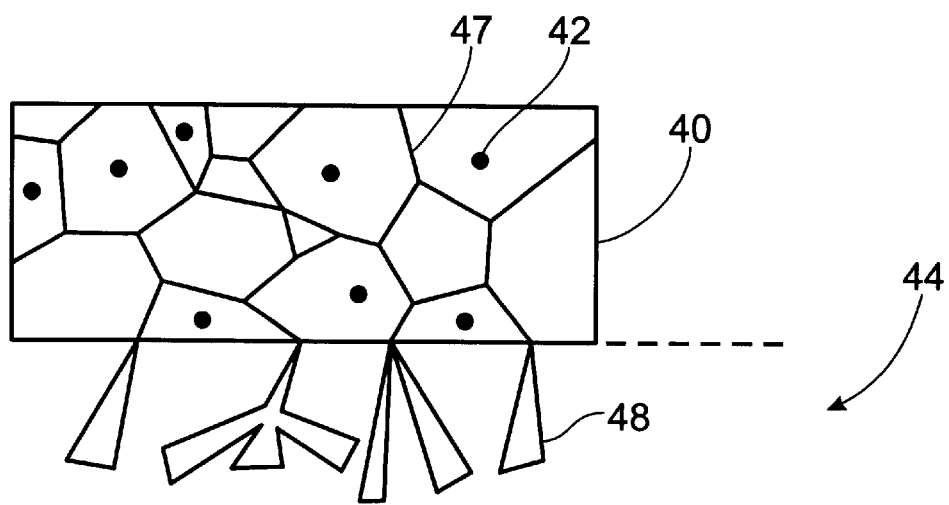

FIG. 6b depicts silicide film 40 of transistor 30 in FIG. 5b after annealing. Thinly grouped silicide grains 42 form with silicide-edged grain crystal boundaries 47. Some silicide grains 42 have silicide only in boundary region 47, or parts of boundary region 47. Anisotropic crystal growth, depicted by reference designator 48 results from the low density of silicide molecules 42. The anisotropic crystal growth associated with low temperature metal-assisted annealing which takes on the characteristics of fibers having a primary growth direction in the <111>orientation, with a width of approximately 100 Å. These relatively long growth fibers produce an uneven growth front which traps enclaves of silicide grains 46 depicted in FIG. 6a. In addition, enclaves of amorphous silicon are also trapped. Polycrystalline film 44, therefore, has high leakage currents and low electron mobility.

The present invention recognizes that by controlling the placement of the transition metal, the regions of silicide in the silicon film can be limited. In this manner, the lateral growth front of crystallization associated with the silicide is considered to be directed. Even if nickel silicide enclaves do occur in the fabrication of the polysilicon, the enclaves are not likely to be formed in sensitive regions of the transistor. The present invention solves a major problem associated with transistors made with a salicide process, by limiting the amount of nickel silicide in the channel region, under the gate.

The present invention also improves the silicide process by addressing the characteristics of the crystal formed with the assistance of a transition metal film, such as nickel. While not intending to be bound by theory, it is believed that a continuous layer of nickel silicide produces a uniform lateral growth front during crystallization, resulting in a higher quality of crystallized film. That is, the crystallization growth front is relatively flat, having a constant velocity in all directions, as compared to the anisotropic fibrous growth associated with typical nickel-assisted polycrystalline formations. The transistors produced from uniform lateral growth crystalline films have high electron mobility and fast response times. The continuous layer of silicide discourages the fibrous anisotropic crystal growth, depicted in FIG. 6b. Because the crystallization along the growth front is less anisotropic, there are a fewer number of fibers protruding from the lateral growth front. The more random crystallographic orientation results in a more uniform lateral growth velocity. A TFT fabricated from such a film will have high electron mobility as well as low leakage current characteristics. Non-continuous transition metal films have a sheet resistance several orders of magnitude higher than continuous films of sufficient thickness.

Figure 7:
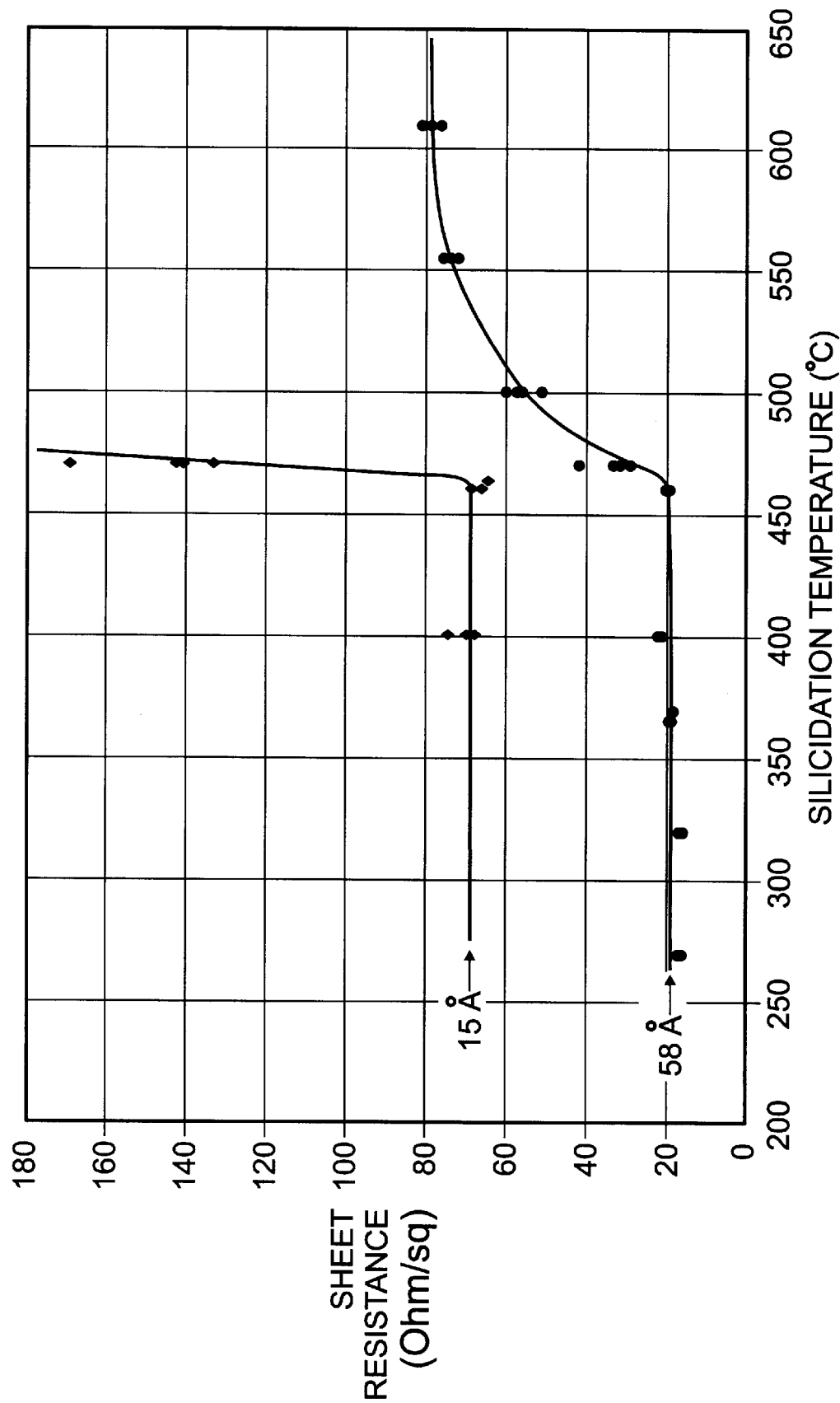
FIG. 7 is a graph depicting the relationship between the sheet resistance of a silicide film and annealing temperature, at two thickness of deposited nickel film.

FIG. 7 is a graph depicting the relationship between the sheet resistance of a continuous silicide film and the annealing temperature, with two different thicknesses of deposited nickel film. A low sheet resistance indicates a continuous layer of silicide film as intended by the present invention. Annealing nickel at a temperature of less than approximately 470° C. produces nickel mono-silicide after the first step of annealing. Annealing nickel at a temperature above 470° C. produces nickel disilicide. Regardless of the type of silicide formed during the first step of annealing, the silicide takes on the disilicide phase during the second step of annealing. The disilicide forms in response to the higher annealing temperatures used to crystallize amorphous silicon. At a metal thickness of approximately 15 Å, the resulting mono-silicide film is continuous, having good conductivity. However, the conductivity severely degrades when disilicide is formed, indicating that the disilicide is non-continuous. The thickness of the deposited nickel is too thin to form a continuous nickel silicide film required by the present invention. With a nickel film thickness of 58 Å, the monosilicide film sheet resistance is approximately 20 ohm/sq., and the disilicide phase is approximately 80 ohm/sq. Thus, a nickel film thickness of 58 Å is sufficient to form a continuous silicide film after annealment. Nickel films thicker than 58 Å will also support low resistance silicide films, however, the use of higher amounts of nickel silicide must be tempered with the concern with nickel silicide enclaves in the crystallized film which produce high leakage currents. The optimum nickel thickness is approximately 30 Å. The exact optimum value is dependent on a number of factors such as materials, annealing temperatures, the shapes and number of the selected areas of amorphous film which are converted to silicide, and the exact density of metal atoms in the deposited transition metal film.

Figure 8:
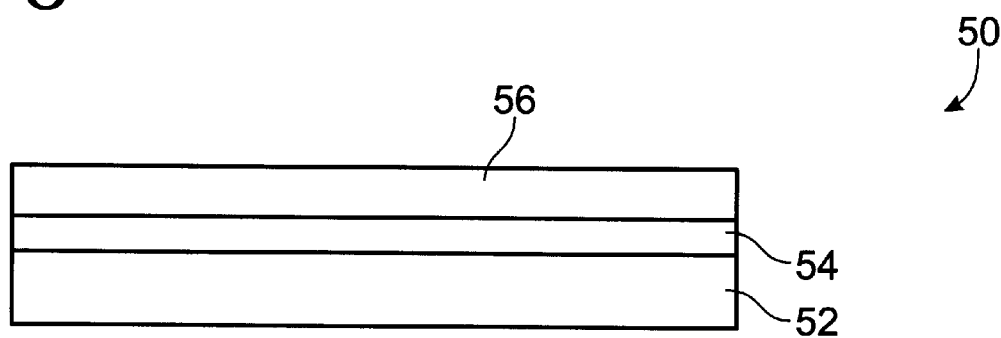
FIGS. 8 through 13 illustrate stages in a method of forming a completed thin-film transistor where nickel has been deposited on selected areas of an amorphous silicon film to control the crystallization growth front during annealing processes.

FIGS. 8 through 13 illustrate stages in a method of forming a completed thin-film transistor where nickel has been deposited on selected areas of an amorphous silicon film to control the crystallization growth front during annealing processes. FIG. 8 is a partial cross-sectional view of a TFT 50 in fabrication. TFT 50 comprises a transparent substrate 52. Transparent substrate 52 is typically glass. Although more fragile, glass is inexpensive. Alternately, substrate 52 is quartz. Typically, transparent substrate 52 is covered with a barrier layer 54. Barrier layer 54 is selected from the group consisting of silicon oxides, silicon nitrides, and combinations of silicon oxides and silicon nitrides. In some aspects of the invention, barrier layer 54 is TEOS oxide having a thickness of 4000 Å. An amorphous film 56 is deposited overlying transparent substrate 52. Amorphous film 56 is selected from the group consisting of silicon, germanium, and silicon-germanium alloys.

Figure 9:
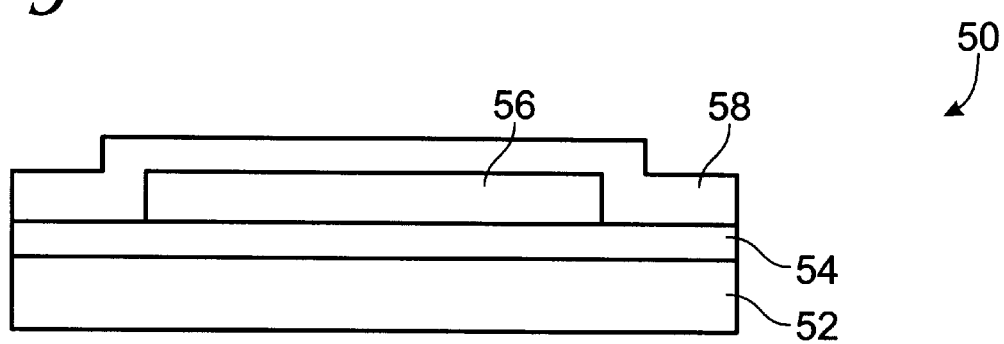

FIG. 9 is a partial cross-sectional view of TFT 50 after the patterning of amorphous film 56 into source/drain regions. An oxide layer 58 is deposited overlying amorphous film 56.

Figure 10:
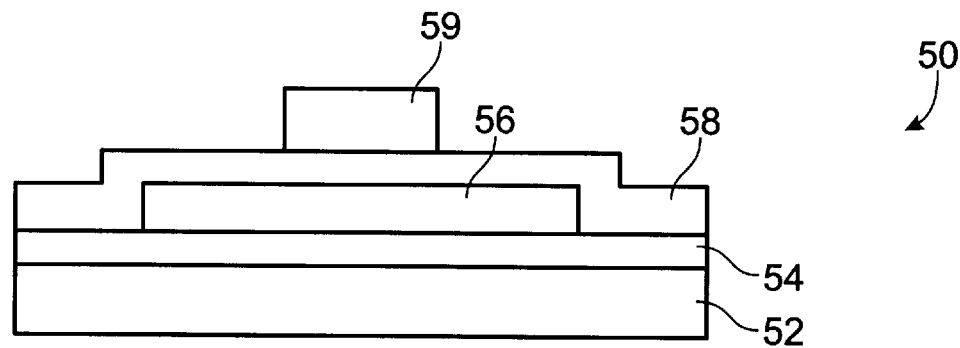

FIG. 10 is a partial cross-sectional view of TFT 50 following the formation of a gate 59 overlying oxide 58. Gate 59 is a semiconductor material film selected from the group consisting of polycrystalline silicon, refractory metals, and polycide. However, other conventional semiconductor materials are suitable. Amorphous film 56 has also been implanted with doping impurities to form source/drain regions. The doping impurities are selected from the group consisting of phosphorous, arsenic, and boron. Other doping materials are also suitable.

Figure 11:
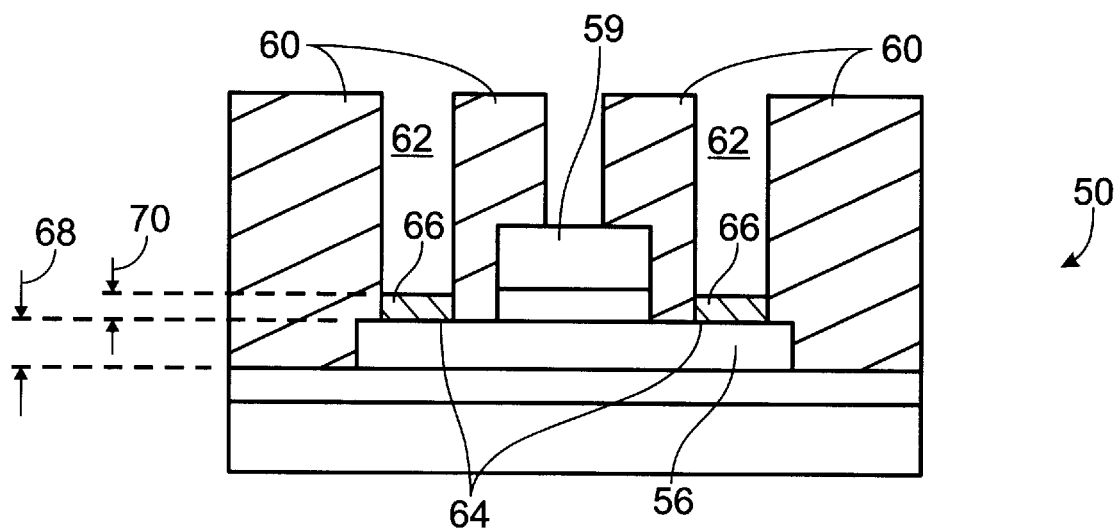

FIG. 11 is a partial cross-sectional view of TFT 50 following the deposition of a dielectric interlevel 60 over amorphous film 56. Dielectric interlevel 60 is patterned to form contact holes 62 through dielectric interlevel 60 accessing amorphous film selected areas 64, and defining the location and size of amorphous film selected areas 64. Typically, a contact hole is formed to gate 59 at the same time. A continuous transition metal film 66 is deposited on selected areas 64 of amorphous film 56. Each selected area 64 has a surface area similar to surface area 21, described above in reference to FIG. 2b. Each selected area 64 has a surface area in the range between 1 and 50 microns$^2$. It is intended that selected areas 64 have surface areas that correspond to standard lithographic techniques of the IC industry, and that smaller surface areas will result from improvements in the resolution of these techniques.

The method of depositing continuous transition metal film 66 is selected from the group consisting of sputtering and e-beam evaporation. E-beam evaporation produces continuous transition metal film 66 with amorphous film 56 at room temperature. However, it is necessary to heat amorphous film 56 to a temperature in the range between 250 and 400° C. when sputtering is used. The continuity of transition metal film 66 is enhanced by the increased mobility of the transition metal on amorphous film 56. Continuous transition metal film 66 is selected from the group consisting of nickel, cobalt, palladium, and platinum. Nickel and cobalt are considered especially useful, as the mismatch between these disilicides and polysilicon is very small. However, other metals which encourage the nucleation of amorphous matter into crystal are usable. Amorphous film 56 has a first thickness 68, and continuous transition metal film 66 has a second thickness 70.

Figure 12:
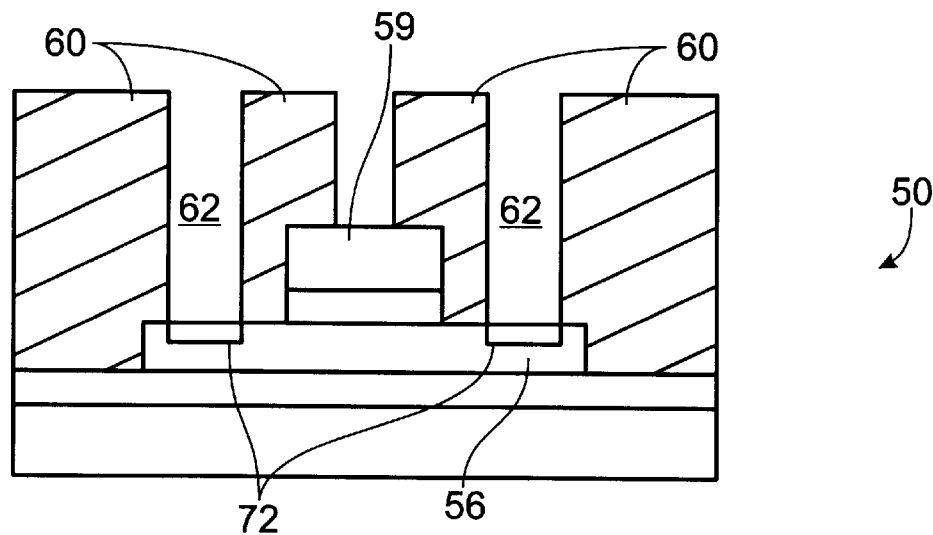

FIG. 12 is a partial cross-sectional view of TFT 50 following a first annealing to form a continuous transition metal semiconductor compound film 72 from depositing continuous transition metal film 66 on selected areas 64 of amorphous film 56. In one aspect of the invention, second thickness 70 (see FIG. 8) is in the range between 14 and 61 Å to form a continuous transition metal semiconductor compound film 72 after the first annealment step. Preferably, second thickness 70 is approximately 30 Å, and first thickness 68 (see FIG. 8) is 500 Å, whereby the thin transistor active regions, to be formed, have high electron mobility and small leakage currents. In one aspect of the invention, continuous transition metal film 66 is nickel. Then, the first annealing step occurs at a temperature in the range between 250 and 550° C. for a period of less than 30 seconds, whereby a continuous nickel silicide film 72 is formed. Although the controlled placement of continuous transition metal film 66 on amorphous film 56 reduces contamination concerns, the short duration and low temperatures of the annealing process minimize transition metal 66 contamination. The continuous transition metal semiconductor compound film 72 has a resistivity in the range between 10 and 100 $\mu$·ohm·cm. The exact resistance is dependent on the materials annealed, the density of metal atoms, and the thickness of continuous transition metal film 66, to name a few factors.

Figure 13:
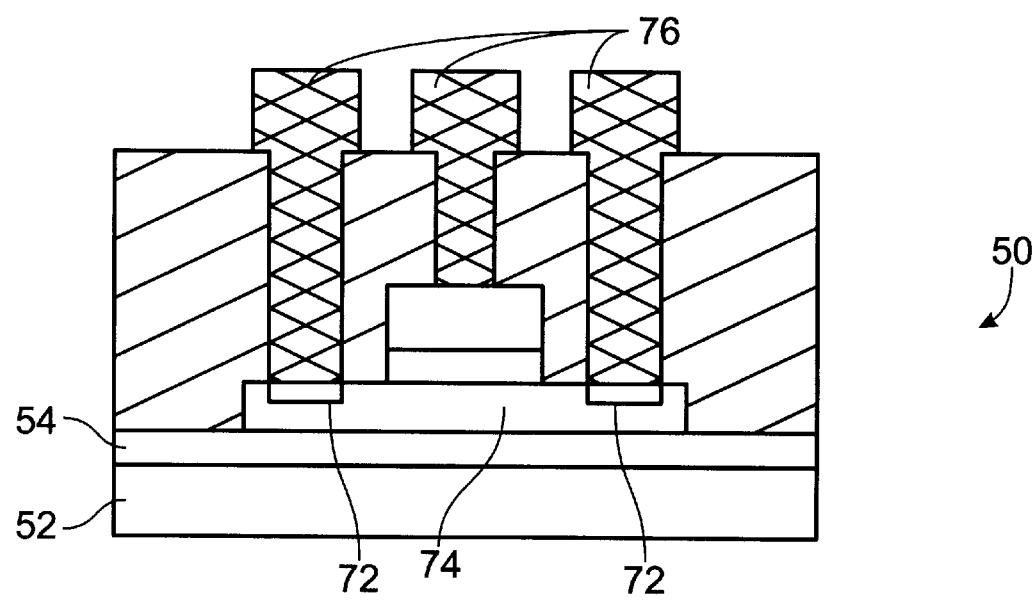

FIG. 13 is a partial cross-sectional view of TFT 50 following a second step of annealing continuous transition metal semiconductor compound film 72, in contact with amorphous film selected areas 64, to form a TFT polycrystalline semiconductor film 74. Polycrystalline film 74 overlies transparent substrate 54 and is in contact with continuous transition metal semiconductor compound film 72. The inclusion of continuous transition metal film 66 to selected areas 64 of amorphous film 56 controls the crystallization growth front. A metal level 76 is also shown filling contacts holes 62 to connect with the finishes source/drain and gate regions of TFT 50. Metal level 76 is shown patterned in preparation for forming contacts to other sections of TFT 50 or to other subsequently deposited metal levels or semiconductor regions (not shown).

Alternately, TFT 50 is fabricated with amorphous film selected areas 64 deposited overlying, and in contact with, continuous transition metal film 66 patterned to be in registration with selected areas 64 (not shown). Films 56 and 66 are then annealed similarly to the method described above. Further, a bottom gate TFT, which is essentially the reverse of the fabrication process described above, is manufactured using the annealing method of the present invention.

In one aspect of the invention, amorphous film 56 is silicon, and the second annealing step occurs at an average temperature in the range between 550 and 1400° C., and a time in the range between 1 nanosecond (ns) and 10,000 seconds. The process of the present invention minimizes the number of transition metal semiconductor compound enclaves in the polycrystalline silicon, which degrade transistor 50 leakage currents. In this manner, continuous transition metal semiconductor compound film 72 assists in the crystallization of the amorphous film.

Figure 14:
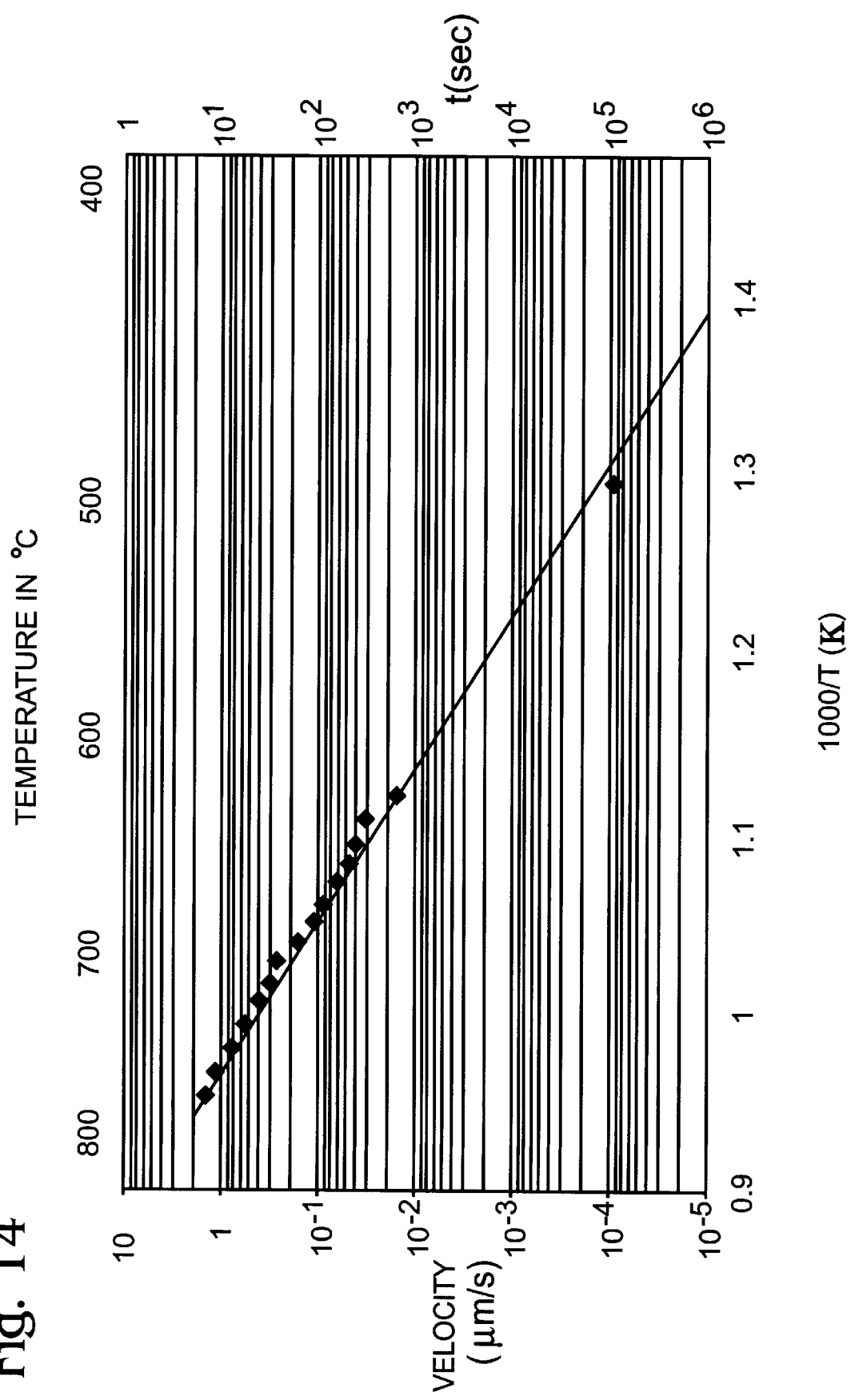
FIG. 14 illustrates the lateral growth velocity of nickel-induced crystallization against the variable of temperature.

The quality of polycrystalline film 74 produced through the present invention is enhanced even further by including the rapid thermal annealing methods of co-pending U.S. patent Ser. No. 08/879,386, filed Jun. 20, 1997, entitled "Thin-Film Transistor Polycrystalline Film Through Nickel Induced, Rapid Thermal Annealing and Method for Same", invented by Masashi Maekawa, which has already been incorporated by reference. Quick annealing times are another advantage of using rapid thermal annealing to crystallize amorphous film 56. FIG. 14 illustrates the lateral growth velocity of nickel-induced crystallization against the variable of temperature. FIG. 14 shows that the annealing time, and lateral growth velocity, are approximately 1000 faster at 800° C. than at 550° C. The present invention recognizes, that with the proper equipment, annealing temperatures from 800 to 1400° C. are also useful in fabrication a high quality crystalline film in response to metal-induced lateral growth.

In the preferred embodiment, transparent substrate 54 is glass, and amorphous film 56 and continuous transition metal semiconductor compound film 72 are preheated before the second, rapid thermal, annealing step at a temperature in the range between 400 and 500° C. Then, the temperature is ramped-up from the preheat temperature to the second annealing temperature at a rate greater than 10° C. per second to minimize the crystal growth during the ramp-up time. Preferably, the ramp-up temperature exceeds 50° C. per second. The rapid thermal annealing step uses a tungsten-halogen lamp, Xe Arc lamp, and an excimer laser. When annealing at a lower temperature, a resistive heat furnace is also used.

Figure 15:
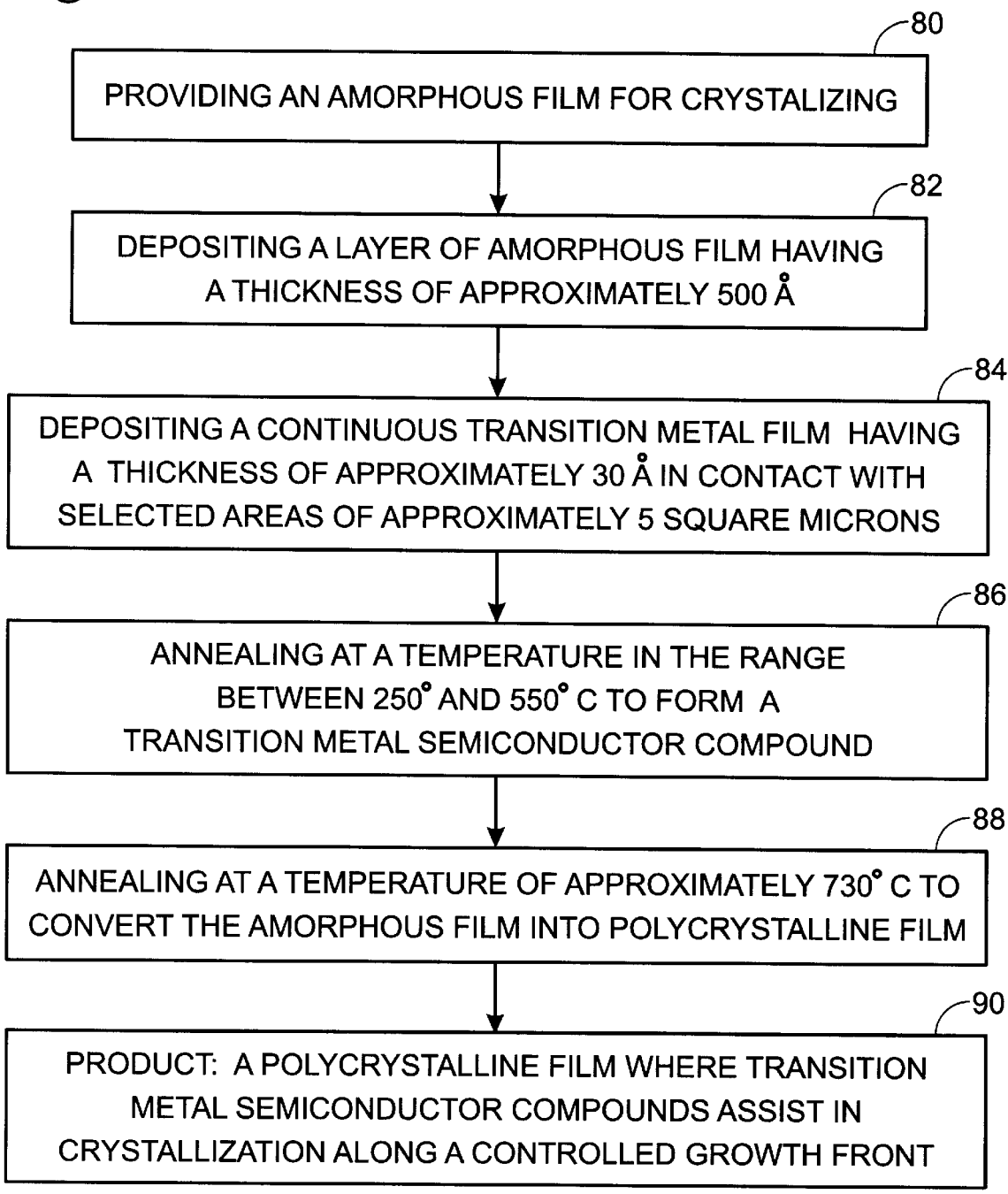
FIG. 15 is a flow chart illustrating steps in a method of crystallizing an amorphous film.

FIG. 15 is a flow chart illustrating steps in a method of crystallizing an amorphous film. FIG. 15 is drawn to the broader method of forming a polycrystalline film, while FIG. 16, described below, is drawn to a more specific method of forming a TFT. Step 80 provides an amorphous film for crystallizing. Step 82 deposits a layer of amorphous film having a thickness of approximately 500 Å. Preferably, the amorphous film is silicon. Step 84 deposits a continuous transition metal film having a thickness of approximately 30 Å in contact with selected areas of the amorphous film having a surface area of approximately 5 micron$^2$. Preferably, the transition metal is nickel. Step 86 anneals, at a temperature in the range between 250 and 550° C, the film deposited in Steps 82 and 84 so that the selected areas of amorphous film in contact with the continuous transition metal film are consumed to form a continuous transition metal semiconductor compound film. Step 88 anneals, at a temperature of approximately 730° C., to convert, at least partially, the amorphous film into polycrystalline film. Step 90 is a product, a polycrystalline film where the continuous transition metal semiconductor compound film assists in crystallization along a controlled growth front.

Figure 16:
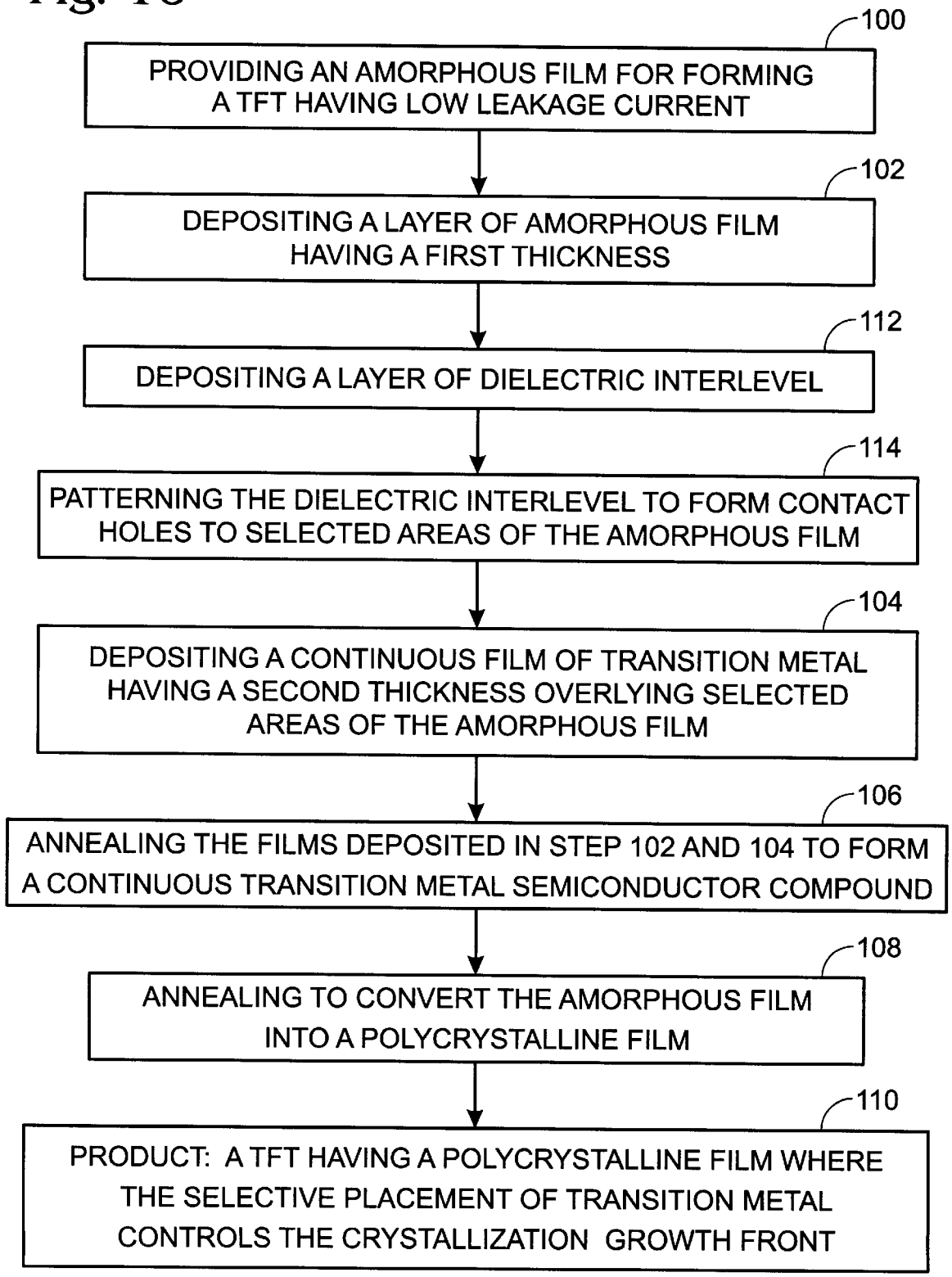
FIG. 16 is a flow chart illustrating steps in a method of crystallizing an amorphous film in the formation of a thin-film transistor with low leakage current.

FIG. 16 is a flow chart illustrating steps in a method of crystallizing an amorphous film in the formation of a thin-film transistor with low leakage current. The method depicted in FIG. 16 roughly corresponds to FIGS. 8 through 13. Step 100 provides an amorphous film to form thin-film transistors having low leakage current. Step 102 deposits a layer of amorphous film having a first thickness. The amorphous film is selected from the group consisting of silicon, germanium, and silicon-germanium alloys. In a preferred embodiment, Step 102 includes depositing an amorphous silicon film having a first thickness of 500 Å. Additional steps after Step 102, not shown in FIG. 16, etch the amorphous film deposited in step 102 to define source/drain regions, and deposit an oxide film overlying the surface of the amorphous film not etched away to form a gate oxide layer. The amorphous layer is etched into selected areas, or islands, by any conventional photolithographic process.

Further steps before Step 104, not shown in FIG. 16, deposit a semiconductor material film overlying the gate oxide layer to form a gate, and implant doping impurities into the amorphous film to form source/drain regions. The semiconductor material film is typically selected from the group consisting of polycrystalline silicon, refractory metals, and polycide. However, other conventional semiconductor materials are suitable. The doping impurities are selected from the group consisting of phosphorous, arsenic, and boron. As is well known in the art, these impurities are used to form n+ or p+ active regions for the source and drain. In some aspects of the invention, a separate RTA process step is used to activate the dopant.

Step 104 deposits a continuous transition metal film having a second thickness overlying, and in contact with, selected areas of the amorphous film. In some aspects of the invention, Step 104 includes each amorphous silicon film selected area having a surface area in the range between 1 and 50 microns$^2$. The transition metal is selected from the group consisting of nickel, cobalt, palladium, and platinum. In one aspect of the invention, Step 104 includes conformably depositing the continuous transition metal film on the selected areas of the amorphous film with a method selected from the group consisting of sputtering and e-beam evaporation. In one aspect of the invention, the continuous transition metal film is deposited by sputtering, and Step 104 includes heating the amorphous film to a temperature in the range between 250 and 400° C., whereby the mobility of the transition metal on the amorphous film selected areas enhances the continuity of the transition metal film.

When the amorphous film is silicon, the second thickness of continuous transition metal film is in the range between 14 and 61 Å, whereby the transition metal film thickness contributes to the formation of a continuous film of transition metal semiconductor compound. Preferably, the second thickness is approximately 30 Å.

Step 106 anneals the film deposited in Steps 102 and 104 so that the selected areas of amorphous film underlying the continuous transition metal film are consumed to form a continuous film of transition metal semiconductor compound. When the amorphous layer is silicon, the nickel semiconductor compound is nickel silicide. When the amorphous layer is germanium, the nickel semiconductor compound is germanide, and when the amorphous layer is a silicon-germanium alloy, then the nickel semiconductor compound is germanosilicide, or nickel germanosilicide. Unreacted transition metal is etched off by a mixture of sulfuric acid and hydrogen peroxide sometimes called a piranha etch. This cleaning step removes substantially all transition metal from the TFT except that which was annealed to form the continuous transition metal semiconductor compound film. When the transition metal is nickel, Step 106 includes annealing at a temperature in the range between 250 and 550° C. for a period of time less than approximately 30 seconds, whereby a continuous nickel semiconductor compound film is formed. Typically, a continuous transition metal semiconductor compound film has a resistivity in the range between 10 and 100 $\mu$·ohm·cm.

Step 108 anneals to convert, at least partially, the amorphous film into polycrystalline film. Step 108 includes annealing with a tungsten-halogen lamp, Xe Arc lamp, excimer laser, and resistance heat furnace. When the amorphous film is silicon, Step 108 includes annealing at an average temperature in the range between 550 and 1400° C., and a time in the range between 1 ns and 10,000 seconds. The length of annealing time directly related to the annealing temperature. This step is also intended to cover the use of fluctuating heat sources that have varying high and low temperatures, but have an average temperature within the limits specified in Step 108. The upper limit of the rapid thermal annealing temperature is selected so as to not induce nucleation of the amorphous film before the required length of lateral growth occurs. Generally, spontaneous nucleation of amorphous silicon film occurs in less than a minute when the rapid thermal annealing temperature exceeds approximately 800° C. The exact timing and temperature needed for the occurrence of spontaneous nucleation is dependent upon the characteristics of the specific amorphous film. Step 110 is a product, a TFT having a polycrystalline film where the selective placement of the transition metal controls the crystallization growth front.

In one aspect of the invention a transparent substrate, selected from the group consisting of glass and quartz, is provided and step 102 includes depositing the amorphous film over the transparent substrate to form a TFT suitable for use in a liquid crystal display (LCD). A preferred embodiment includes a glass substrate. This embodiment includes Step 108 being a rapid thermal anneal. Then, further steps are provided, before Step 108. One additional step preheats the amorphous film at a temperature in the range between 400 and 500° C. Another additional step ramps the temperature up from the preheat temperature to the annealing temperature of Step 108 at a rate of greater than 10° C. per second. Preferably, the ramp-up temperature is greater than 50° C. per second. It is understood that the various preheat, ramp-up, and annealing temperatures are defined as the temperature experienced by the amorphous layer.

It is important for the crystallization process that the rapid thermal annealing temperature be reached quickly. To achieve this goal, the TFT is preheated before the second annealing step. Then, the temperature is ramped-up very quickly, until the rapid thermal annealing temperature is reached. This rapid ramp-up process reduces the transition metal-assisted crystal growth that occurs during the ramp-up time, when temperatures are lower, which produces a poor quality crystal. The rapid temperature ramp-up also acts to avoid spontaneous nucleation as the amorphous layer crystallizes. Spontaneous nucleation produces a lessor quality crystallization with electron mobility characteristics typically less than 30 $cm^2$/Vs.

Step 112, before Step 104, deposits a dielectric interlevel overlying the amorphous film. Step 114 patterns the dielectric to form contact holes through the dielectric interlevel, accessing the amorphous film so that the continuous transition metal film is deposited on selected areas of the amorphous film in step 104. The positioning and size of the contact holes define the location and size of the amorphous film selected areas, and where salicidation occurs.

The present invention acts to control the placement and continuity of a transition metal, refining the process of metal-induced crystallization. The proper thickness of continuous transition metal film insures a continuous layer of transition metal semiconductor compound to reduce fibrous crystal growth during crystallization, which produces a crystalline film capable of support high electron mobility. The upper limit of the thickness helps insure that a minimum amount of metal is used, reducing the risk of poor leakage currents due to metal enclaves in the crystal. The selective placement of the transition metal helps insure that channel regions, and other sensitive areas, remain free of metal compounds used to enhance crystallization. High annealing temperatures also help insure that a continuous silicide film promotes the lateral crystal growth necessary to fabrication a high mobility crystalline film for a TFT. Variations in process steps and IC structures derived from the present invention, as well as other embodiments of the invention, will occur to those skilled in the art.

what is claimed is:

1. In forming thin-film transistors having low leakage current, a method for crystallizing an amorphous film comprising the steps of:

a) depositing a layer of the amorphous film having a first thickness;

b) depositing a layer of a continuous transition metal film having a second thickness overlying, and in contact with, selected areas of the amorphous film;

c) annealing the films deposited in steps a) and b) so that the selected areas of amorphous film underlying the continuous transition metal film are consumed to form a continuous film of transition metal semiconductor compound;

$c_1$) preheating the amorphous film at a temperature in the range between 400 and 500° C.;

$c_2$) ramping the temperature up from the preheating temperature of step $c_1$) to the annealing temperature of step d) at a rate greater than 10° C. per second, whereby minimal crystal growth occurs during the ramp-up time; and d) annealing to convert, at least partially, the amorphous film into a polycrystalline film, whereby the selective placement of the transition metal controls the crystallization growth front.

2. A method as in claim 1 in which the amorphous film is selected from the group consisting of silicon, germanium, and silicon-germanium alloys.

3. A method as in claim 2 in which the transition metal is selected from the group consisting of nickel, cobalt, palladium, and platinum.

4. A method as in claim 3 wherein the amorphous film is silicon, and in which step b) includes depositing a second thickness of continuous transition metal film is in the range between 14 and 61 Å, whereby the transition metal film thickness contributes to the formation of a continuous film of transition metal semiconductor compound.

5. A method as in claim 4 in which step b) includes depositing a continuous transition metal film having a second thickness of approximately 30 Å.

6. A method as in claim 5 in which step b) includes each amorphous film selected area having a surface area in the range between 1 and 50 microns$^2$.

7. A method as in claim 3 wherein the continuous transition metal film is nickel, and in which step c) includes annealing at a temperature in the range between 250 and 550° C. for a period of time less than approximately 30 seconds.

8. A method as in claim 7 in which step c) includes the transition metal semiconductor compound film having a resistivity in the range between 10 and 100 $\mu$·ohm·cm.

9. A method as in claim 2 wherein the amorphous film is silicon, and in which step d) includes annealing at an average temperature in the range between 550 and 1400° C., and a time in the range between 1 ns and 10,000 seconds, whereby the continuous transition metal semiconductor compound film assists in the crystallization of the amorphous film.

10. A method as in claim 1 wherein a transparent substrate is provided, with the transparent substrate being selected from the group consisting of glass and quartz, and in which step a) includes depositing the amorphous film over the transparent substrate, whereby the thin-film transistor is suitable for use in a liquid crystal display (LCD).

11. A method as in claim 1 in which step $c_2$) includes a ramp-up temperature rate exceeding 50° C. per second.

12. A method as in claim 1 including the further steps, before step b), of:
   g) depositing a dielectric interlevel overlying the amorphous film;
   h) patterning the dielectric interlevel to form contact holes through the dielectric interlevel, accessing the amorphous film so that the continuous transition metal film is deposited on selected areas of the amorphous film in step b), defining the location and size of the amorphous film selected areas.

13. A method as in claim 12 in which step b) includes conformally depositing the continuous transition metal film on the selected areas of the amorphous film with a method selected from the group consisting of sputtering and e-beam evaporation.

14. A method as in claim 13 wherein the continuous transition metal film is deposited by sputtering, and in which step b) includes heating the amorphous film to a temperature in the range between 250 and 400° C., whereby the mobility of the transition metal on the amorphous film selected areas enhances the continuity of the transition metal film.

15. A method as in claim 1 including the additional steps, following step a), of:
   i) etching selected areas of the amorphous film deposited in step a); and
   j) depositing an oxide film overlying the surface of the amorphous film not etched away in step i) to form a gate oxide layer.

16. A method as in claim 15 wherein a semiconductor material is provided, selected from the group consisting of polycrystalline silicon, refractory metals, and polycide, and including the additional step, following step j), of:
   k) depositing the semiconductor material film overlying the surface of the gate oxide layer to form a gate.

17. A method as in claim 16 including the step, following step k), of:
   l) implanting doping impurities into the amorphous film to form source/drain regions, wherein the doping impurities are selected from the group consisting of phosphorous, arsenic, and boron.

18. A method as in claim 1 in which step d) includes annealing with a tungsten-halogen lamp, Xe Arc lamp, excimer laser heat source, and resistance heat furnace.

19. A method of crystallizing an amorphous film comprising the steps of:
   a) depositing a layer of amorphous film having a thickness of approximately 500 Å;
   b) depositing a continuous transition metal film having a thickness of approximately 30 Å, in contact with selected areas of the amorphous film having a surface area of approximately 5 microns$^2$;
   c) annealing, at a temperature in the range between 250 and 550° C., the films deposited in steps a) and b) so that the selected areas of amorphous film in contact with the continuous transition metal film are consumed to form a continuous film of transition metal semiconductor compound; and
   d) annealing, at a temperature of approximately 730° C., to convert, at least partially, the amorphous film into polycrystalline film, whereby the continuous transition metal semiconductor compound film assists in crystallization along a controlled growth front.

20. A method as in claim 19 in which the amorphous film is silicon and the transition metal is nickel.

* * * * *